(12) United States Patent
Rana et al.

(10) Patent No.: US 7,569,462 B2
(45) Date of Patent: Aug. 4, 2009

(54) DIRECTIONAL CRYSTALLIZATION OF SILICON SHEETS USING RAPID THERMAL PROCESSING

(75) Inventors: Virendra V. Rana, Los Gatos, CA (US); Robert Z. Bachrach, Burlingame, CA (US)

(73) Assignee: Applied Materials, Inc., Santa Clara, CA (US)

( * ) Notice: Subject to any disclaimer, the term of this patent is extended or adjusted under 35 U.S.C. 154(b) by 117 days.

(21) Appl. No.: 11/610,049

(22) Filed: Dec. 13, 2006

(65) Prior Publication Data
US 2008/0142763 A1    Jun. 19, 2008

(51) Int. Cl.
*H01L 21/36* (2006.01)
(52) U.S. Cl. ............... 438/490; 136/258; 257/70; 257/72; 257/64; 117/4; 117/10; 438/488; 438/491
(58) Field of Classification Search ............... 252/501.1; 257/64, 70, 72; 136/258; 117/4, 10; 438/488, 438/490, 491
See application file for complete search history.

(56) References Cited

U.S. PATENT DOCUMENTS

| | | |
|---|---|---|
| 4,370,510 A | 1/1983 | Stirn |
| 4,492,813 A | 1/1985 | Kausche et al. |
| 4,643,797 A | 2/1987 | Grabmaier et al. |
| 4,670,096 A | 6/1987 | Schwirtlich et al. |
| 4,690,797 A | 9/1987 | Eyer et al. |
| 5,106,763 A | 4/1992 | Bathey et al. |
| 5,298,109 A | 3/1994 | Knauth et al. |
| 5,336,335 A | 8/1994 | Hall et al. |
| 5,490,477 A | 2/1996 | Knauth et al. |
| 5,496,446 A | 3/1996 | Yeoman et al. |
| 5,578,502 A | 11/1996 | Albright et al. |
| 5,714,404 A | 2/1998 | Mitlitsky et al. |
| 6,111,191 A | 8/2000 | Hall et al. |
| 6,207,891 B1 | 3/2001 | Hall et al. |
| 6,261,361 B1 | 7/2001 | Iida et al. |
| 6,488,770 B1 | 12/2002 | Meissner et al. |
| 7,307,283 B2 * | 12/2007 | Yoshimoto ............ 257/72 |

(Continued)

FOREIGN PATENT DOCUMENTS

DE             4105910             8/1992

OTHER PUBLICATIONS

Search Report issued Apr. 16, 2008 in PCT/US2007/87150.

*Primary Examiner*—Mark Kopec
*Assistant Examiner*—Haidung D. Nguyen
(74) *Attorney, Agent, or Firm*—Pillsbury Winthrop Shaw Pittman, LLP

(57) ABSTRACT

The present invention provides a method of recrystallizing a silicon sheet, and in particular recrystallizing a small grained silicon sheet to improve material properties such as grain size and orientation. According to one aspect, the method includes using rapid thermal processing (RTP) to melt and recrystallize one or more entire silicon sheet(s) in one heating sequence. According to another aspect, the method includes directionally controlling a temperature drop across the thickness of the sheet so as to facilitate the production of a small number of nuclei in the melted material and their growth into large grains. According to a further aspect, the invention includes a re-crystallization chamber in an overall process flow that enables high-throughput processing of silicon sheets having desired properties for applications such as photovoltaic modules.

20 Claims, 2 Drawing Sheets

U.S. PATENT DOCUMENTS

| | | |
|---|---|---|
| 2002/0139298 A1 | 10/2002 | Okui et al. |
| 2005/0079294 A1 | 4/2005 | Lin et al. |
| 2005/0116229 A1 | 6/2005 | Yoshimoto |
| 2005/0189542 A1 | 9/2005 | Kudo et al. |
| 2006/0014337 A1 | 1/2006 | Takemura |
| 2006/0186412 A1 | 8/2006 | Jyomonji et al. |

* cited by examiner

DIRECTIONAL CRYSTALLIZATION OF SILICON SHEETS USING RAPID THERMAL PROCESSING

FIELD OF THE INVENTION

The present invention relates generally to photovoltaic devices, and more particularly to a method for crystallizing silicon in a silicon sheet by directional solidification using rapid thermal processing (RTP).

BACKGROUND OF THE INVENTION

Photovoltaics (PV) or solar cells are devices which convert sunlight into direct current (DC) electrical power. A typical PV cell includes a p type silicon wafer, substrate or sheet typically less than about 0.3 mm thick with a thin layer of n-type silicon on top of a p-type region formed in a substrate. The generated voltage, or photo-voltage, and generated current by the photovoltaic device are dependent on the material properties of the p-n junction and the surface area of the device. When exposed to sunlight (consisting of energy from photons), pairs of free electrons and holes are generated in the silicon. The electric field formed across the depletion region of p-n junction separates the free electrons and holes, creating a voltage. A circuit from n-side to p-side allows the flow of electrons when the PV cell is connected to an electrical load. Electrical power is the product of the voltage times the current generated as the electrons and holes move through an external load and eventually recombine. Solar cells generate a specific amount of power and cells are tiled into modules sized to deliver the desired amount of system power. Solar modules are created by connecting a number of solar cells which are then joined into panels with specific frames and connectors.

It has been estimated that more than 95% of all photovoltaic modules are silicon wafer based. However, other types of modules such as thin-film based solar cells are being explored because of their promise of lower cost, albeit while providing lower efficiencies than silicon based modules. Therefore, reducing the cost of silicon wafer based photovoltaic modules, particularly their manufacturing costs, is a major challenge in keeping such modules commercially viable.

In order to meet these challenges, the following solar cell processing requirements generally need to be met: 1) the consumption of silicon must be reduced (e.g., thinner substrates, reduction of manufacturing waste), 2) the cost of ownership (COO) for substrate fabrication equipment needs to be improved (e.g., high system throughput, high machine up-time, inexpensive machines, inexpensive consumable costs), 3) the substrate size needs to be increased (e.g., reduce processing per watt peak, Wp) and 4) the quality of the silicon substrates needs to be sufficient to produce highly efficient solar cells. There are a number of solar cell silicon substrate, or solar cell wafer, manufacturing technologies that are under development to meet the requirement of low silicon consumption in combination with a low COO. Due to the pressure to reduce manufacturing costs and due to the reduced demands on substrate characteristics, such as surface morphology, contamination, and thickness variation, a number of dedicated substrate manufacturing lines specifically designed to produce substrates for solar cells have been established. In these respects solar cell substrates differ in many respects to typical semiconductor wafers.

Crystalline silicon is the material from which the vast majority of all solar cells are currently manufactured. Monocrystalline and multicrystalline silicon form the two principle variants of the silicon material used for solar cells. While monocrystalline silicon is usually pulled as a single crystal from a silicon melt using the Czochralski (CZ) process, there are a number of production processes for multicrystalline silicon. Typical multicrystalline silicon processes are block crystallization processes, in which the silicon substrates are obtained by forming and then sawing a solid polycrystalline silicon block, film-drawing processes, in which the substrates are drawn or cast in their final thickness as a silicon film is pulled from a molten material, and sintering processes in which the substrates are formed by melting a silicon powder. Examples of these substrate fabrication process are the EFG process (Edge-defined Film-fed Growth) (e.g., U.S. Pat. No. 5,106,763), the RGS (Ribbon Growth on Substrate) process (e.g., U.S. Pat. No. 4,670,096, U.S. Pat. No. 5,298,109, DE 4,105,910 A1) and the SSP ribbon process (Silicon Sheets from Powder) (e.g., U.S. Pat. No. 5,336,335, U.S. Pat. No. 5,496,446, U.S. Pat. No. 6,111,191, and U.S. Pat. No. 6,207,891). For high speed ribbon type silicon substrate forming processes to be viable, the challenge is to reach sufficient substrate quality and solar cell efficiency to provide low cost solar electricity.

Of the above polycrystalline processes, the most promising substrate manufacturing technologies include those where liquid silicon is directly crystallized in the form of a silicon substrate or ribbon (so-called ribbon technologies). Co-pending application Ser. No. 11/325,089, the contents of which are incorporated herein reference, advanced the state of the art of silicon-based photovoltaic modules by disclosing an apparatus and method for fabricating large surface area polycrystalline silicon sheets. An example aspect of that invention is that molten silicon is sprayed through spray nozzles suspended over a sheet support platen. Drops and ligaments from the liquid spray rapidly solidify on the platen and build up to form a polycrystalline silicon sheet.

FIG. 1A illustrates a silicon sheet 20 that is formed as described in the process above. It can be seen that (although exaggerated somewhat for purposes of illustration) sheet 20 includes many overlapping solidified silicon drops and/or ligaments 22. As further shown in FIG. 1B, each of these drops or ligaments 22 may have their own crystalline structure comprising small grains 24. Similarly, silicon sheets obtained using other ribbon technologies have many small grains, which potentially limit their use in solar cell applications. This is further illustrated in FIG. 1A. As shown in FIG. 1A, when sheet 20 is further processed to form a solar cell and used to provide power to a load $R_L$ coupled thereto or to a photovoltaic module comprising sheet 20, the small grains 24, particularly those having grain boundaries normal to the direction of charge carrier flow, will decrease the amount of current produced, and thus limit the efficiency of the module.

To improve the film properties, typically the sheet is recrystallized in a process following the formation process. In one example, this is done by moving a molten zone along the length of the sheet. However, this process is slow and also introduces stress in the film, among other problems. Moreover, such recrystallization processes cannot reliably improve grain structure with respect to certain desired properties, such as the reduction of grain boundaries normal to the direction of charge carrier flow in a solar cell. In related arts, a process called solid phase crystallization (SPC) is known in which film is crystallized without melting it. However, SPC processing is also slow and not as effective in reducing film defects such as dislocations.

Therefore, there remains a need in the art for a recrystallization process that can efficiently and reliably produce a silicon film or sheet with acceptable film properties.

SUMMARY OF THE INVENTION

The present invention provides a method of recrystallizing a silicon film or sheet, and in particular crystallizing a small grained crystalline and/or amorphous silicon sheet to improve material properties such as grain size and orientation. According to one aspect, the method includes using rapid thermal processing (RTP) to melt and recrystallize one or more entire silicon sheet(s) in one heating sequence. According to another aspect, the method includes controlling a temperature drop across the thickness of the sheet so as to facilitate the production of a small number of nuclei in the molten silicon and their growth into large grains in a direction normal to the horizontal surface of the film or sheet. According to a further aspect, the invention includes a re-crystallization chamber in an overall process flow that enables high-throughput processing of silicon sheets having desired properties for applications such as photovoltaic modules.

In furtherance of these and other aspects, a method of processing a silicon material according to the invention comprises controlling a direction of recrystallization of melted silicon material. In embodiments, this method further comprises establishing a thermal gradient in the material corresponding to the direction. For example, the direction corresponds to a thickness between two surfaces of a silicon sheet. In additional furtherance of these and other aspects, a method of processing a sheet of silicon material according to the invention, comprises heating the sheet to completely melt the silicon material to a predetermined thickness of the sheet, and controllably lowering the temperature of the sheet to allow the melted silicon material to solidify, the controllably lowering step including establishing a temperature gradient in the melted material corresponding to a desired direction of solidification. In embodiments, this method includes performing the heating and controllably lowering steps using rapid thermal processing. In other embodiments of this method, the sheet has top and bottom surfaces, and the temperature gradient is established between the top and bottom surfaces.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

Figure 1A:
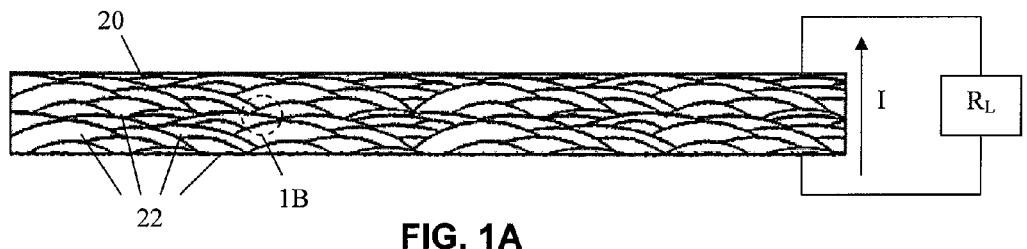
FIGS. 1A and 1B illustrate certain problems arising from the formation of silicon sheets according to related art.
Figure 1B:
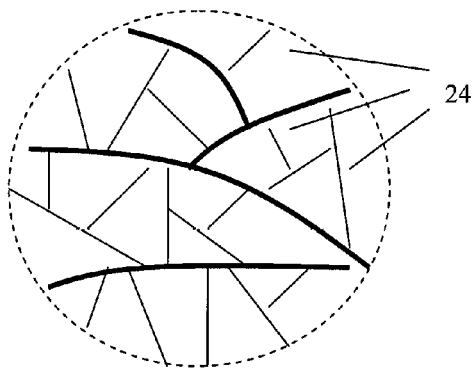

The present invention will now be described in detail with reference to the drawings, which are provided as illustrative examples of the invention so as to enable those skilled in the art to practice the invention. Notably, the figures and examples below are not\ meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In general, the present invention provides an apparatus and method for processing a silicon film or sheet suitable for use in a solar cell. According to certain aspects, particular suitability according to the invention includes sheets having low residual stress and large grain size and/or structure with desired properties, such as grain size larger than a thickness of the sheet and reduction of grain boundaries normal to the direction of charge carrier flow. According to certain aspects, the invention includes a solidification process that further ensures the sheet will have the desired grain size and/or structure properties by controlling the direction of solidification/crystallization along the thickness of the sheet.

Certain aspects of the present invention will be described hereinbelow in connection with a preferred embodiment of recrystallizing a silicon sheet produced in conjunction with any number of silicon sheet fabrication technologies such as spraying, sintering (e.g. SSP), pulling film from a melt (e.g. RGS), and the method described in co-pending application Ser. No. 11/325,089. However, the invention is not limited to this embodiment, and is considered applicable to other types of silicon substrates and fabrication methods. Indeed, the invention is believed useful for virtually any type of silicon material where improved crystalline properties are desired (as opposed to, for example, mono- or multi-crystalline silicon materials already having desired properties), including amorphous silicon, mixed amorphous and micro-crystalline silicon, micro-crystalline silicon, polycrystalline and smaller grained multi-crystalline silicon. Moreover, aspects of the present invention can be used for solar cell processing, semiconductor processing, or any other sheet or substrate processing technique.

According to certain aspects, the invention can be used to process one or many sheets that have a large surface area in the range of 100 to 400 $cm^2$ in a single process sequence. For example, the invention can be used to process current industry standard sheets of about 125×125 mm and 156×156 mm, and the principles of the invention can be readily extended to even larger surface areas that are being considered for silicon sheets, even up to 1000 or 2400 $cm^2$. It should be noted that the terms semiconductor sheet, silicon sheet, or sheet, as used herein is intended to broadly describe a substrate, wafer, film or ribbon that can be used to form a solar cell or other similar semiconductor type devices thereon, and are intended to be illustrative rather than specifying any particular geometry or application.

Figure 2:
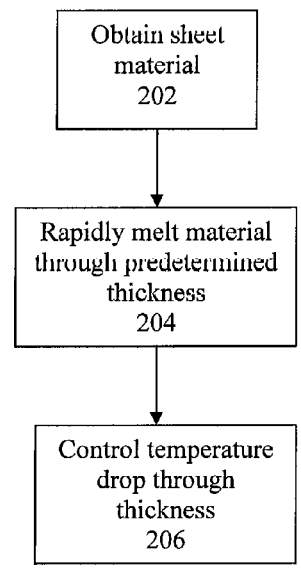
FIG. 2 is a flowchart illustrating a recrystallization method according to an embodiment of the invention.

FIG. 2 illustrates an example recrystallization method in accordance with certain aspects of the invention. A first step 202 includes obtaining a silicon sheet. In one preferred example, this step can include receiving, in a recrystallization chamber, one or more sheets that have been formed using spraying, sintering of powder (e.g., SSP), drawing from a melting process (e.g. RGS) or other various processing methods including those described above.

In step 204 the sheet(s) is heated to a temperature at or above the melting point of the silicon sheet material to allow the material to melt and then re-solidify or recrystallize. It should be noted that the term recrystallize as used herein is generally intended to refer to a process of solidification/crystallization of silicon sheet material that has been brought completely or mostly to a molten state, and the term should not be limited by the examples herein, except that it should not be confused with crystallization processes that do not include melting, such as solid phase crystallization, or other conventional processes that may incidentally affect crystal properties such as annealing. As should be further apparent from the descriptions herein, the invention should also not be confused with a recrystallization process wherein a molten zone is moved from one side of a substrate to the other side.

In one example of step 204, the sheet(s) is heated above the melting point of the sheet material, which is about 1412° C. for silicon. In a preferred embodiment wherein an RTP heating method is employed, the material is rapidly heated to about 1430° C. to allow the silicon material to completely melt through its thickness. In other embodiments, the material in the sheet(s) is not completely melted through the thickness, but is stopped short by a predetermined amount in order to use the remaining solid material as a seed for directional crystallization of the melted material. Those skilled in the art will understand how to perform these various embodiments of the melting step using conventional RTP equipment having various power levels and with various sheet thicknesses and materials. In one example using conventional RTP equipment and a silicon sheet about 0.2 mm thick, this step can take as quickly as 10 seconds.

In a next step 206, after the material is melted, the heat is stopped or lowered in a manner to create a desired gradient across the sheet thickness and thereby control a directional crystallization process. In embodiments, this involves developing a typical gradient of less than 20° C./cm between a top surface of the sheet and a bottom surface of the sheet.

In one example, the melted film can be crystallized starting from a bottom surface of the sheet material. In some embodiments, this involves controlling RTP equipment that heats the sheet from an exposed top surface while the bottom surface is in contact with a chuck. In this case, the temperature at the bottom surface will be lower than a temperature on the top surface, and the temperature difference will be maintained by the RTP equipment as both temperatures drop.

In one example where the material in the sheet(s) is completely melted through its thickness, solidification starts from the bottom surface and proceeds to the top surface in accordance with the controlled temperature gradient without any seed material. In this example, it is preferred that the chuck material in contact with the bottom surface does not introduce any contaminants and/or does not otherwise interfere with the solidification process. In another example, where the melting of the material in the sheet(s) is stopped at a predetermined thickness, the non-melted material in the sheet(s) can itself act as a seed material for the solidification of the melted material toward the top surface. In yet another example, the melting proceeds through the entire thickness of the sheet and a seed material is present between the bottom surface of the sheet and a chuck or other supporting component in order to promote the directional solidification process. Various seed materials and methods of promoting solidification are possible, and details thereof will be omitted here for clarity of the invention.

In alternative embodiments, the film can be solidified from a top surface rather than from a bottom surface. In either event, the controlled temperature gradient across the thickness of the film, and between the surfaces, results in a small number of nuclei and their growth into large grains in a direction from one surface to the other corresponding to the gradient. Additional auxiliary heaters may be used to obtain the desired longitudinal liquid-solid interface. For a sheet with a thickness of about 0.2 mm, and a gradient of about 20° C./cm, the directional solidification will take approximately 10 sec. With a gradient of about 3.5° C./cm, the directional solidification will take about 1 minute. Other gradients, higher and lower than these examples, are possible.

According to aspects of the invention, the directional crystallization/solidification will increase the crystalline grain size and produce substantially columnar grains (i.e. grain structures with boundaries that extend substantially perpendicular to the opposing sheet surfaces). The larger grains obtained by this process increase the potential efficiency of solar cells made from the silicon sheet. Moreover, the sheet so recrystallized will also have a low concentration of other defects such as dislocations.

Figure 3:
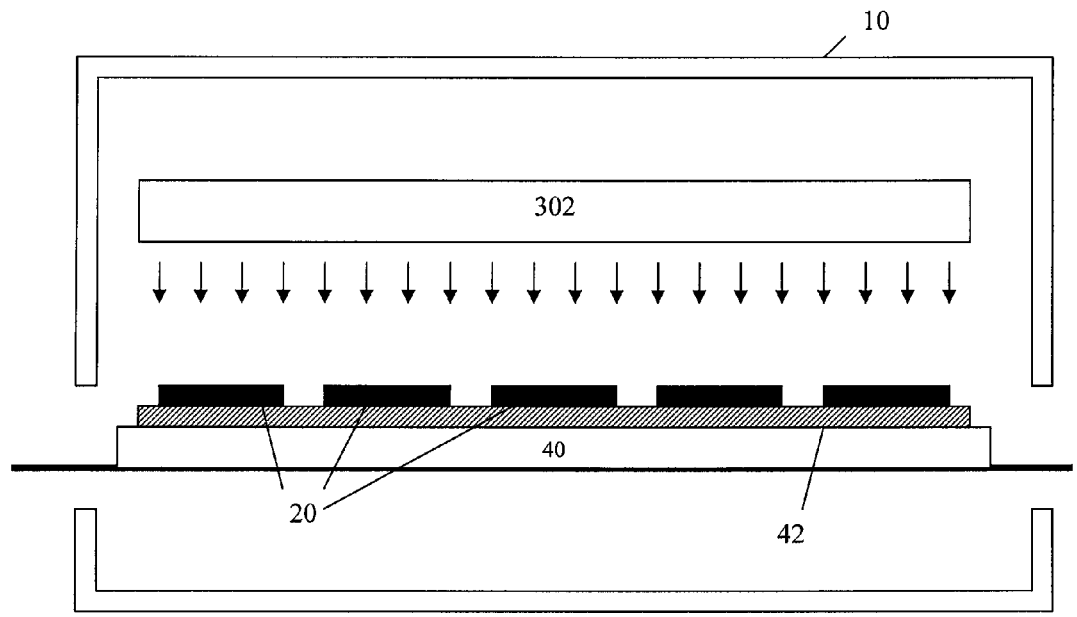
FIG. 3 is a cross-sectional side view of a recrystallization chamber for processing a silicon sheet in accordance with aspects of the invention.

One embodiment of an apparatus capable of performing the sheet processing sequence 200 is illustrated in FIG. 3. This embodiment can be incorporated in an overall process flow following the completion of sheet formation in accordance with any of the above-described or other processes. Generally and without limitation, the re-crystallization process of the present invention can be used to form a sheet that has substantially columnar and/or large grain structures and that has relatively flat and smooth surfaces.

FIG. 3 illustrates one embodiment of a recrystallization chamber 10 that can be used to perform the re-crystallization process of the invention. While the description below discusses its use as a re-crystallization chamber 10, one skilled in the art will appreciate that the various embodiments discussed below may also be used to perform a process of preheating the sheet to a relatively uniform temperature and/or cooling the sheet to a desired temperature.

The recrystallization process is performed on sheet material conveyed into the chamber 10 via sheet support platen 40. In general, the recrystallization process of the invention is performed on all of one or more sheets 20 at a time, to cause the material to form a sheet(s) having a columnar grain structure and/or having grain sizes that are larger than the distance between the resulting sheet surfaces (i.e. larger than the thickness of the sheet).

In one embodiment of the re-crystallization chamber 10, the heating source is comprised of an upper heating source 302 adapted to transfer energy to the top surface of the sheet material in sheet support platen 40. In one aspect, the upper heating source 302 contains multiple radiant lamps that are adapted to radiantly heat the material to form a sheet(s) that has a desired crystalline structure. For example, the upper heating source 302 comprises Vantage RadiancePlus RTP lamps from Applied Materials of Santa Clara, Calif. In another example, the upper heating source 302 forms, or contains, one or more inductive heating sources such as RF powered coils which inductively heat the sheet material on the sheet support platen 40.

Although not shown in FIG. 3, some embodiments may include a lower heating source additionally or alternatively to upper heating source 302. In one aspect, the upper heating source 302 and the lower heating source can deliver different amounts of energy to the sheet to form a temperature gradient across the silicon material to control the re-crystallization process.

As shown in FIG. 3, heating source 302 is dimensioned and/or adapted so that when the sheet support platen 40 is positioned underneath the upper heating source 302, the entire sheet material in the one or more sheets 20 therein may be heated all at once to deliver a uniform temperature profile across all the silicon material in the one or more sheets disposed on sheet support platen 40. Those skilled in the art will be able to select and/or adapt conventional RTP equipment to deliver such a uniform temperature profile.

In the example embodiment of FIG. 3, support platen 40 includes a chuck 42 in contact with a bottom surface of the sheet 20 material that will be cooler than the heating source 302 and thus facilitate the process of establishing the desired temperature gradient. In this example, the nucleation and crystal growth will start from the bottom surface of the sheet. Alternatively, when a lower heating source is provided instead of upper heating source 302, nucleation will start at the top surface. In this case, a nucleation agent, such as a silicon crystallites or other suitable nucleating agents sprinkled on the exposed top surface at a suitable time in the process flow may be needed to assist with nucleation. It should be noted that additional auxiliary heaters, such as heat baffles positioned in areas to the side of sheet material, may be used to obtain the desired longitudinal liquid-solid interface.

The support platen 40 and chuck 42 are comprised of materials that can withstand the high temperatures used in chamber 10. For example, the support platen 40 can be comprised of a ceramic material such as $Al_2O_3$, mullite, or similar materials. Chuck 42 can be comprised of SiC or SiN, graphite, or a graphite with a coating of SiC or SiN, or similar materials. These materials are provided as examples to illustrate the invention, and the invention is not limited by these illustrations.

Figure 4:
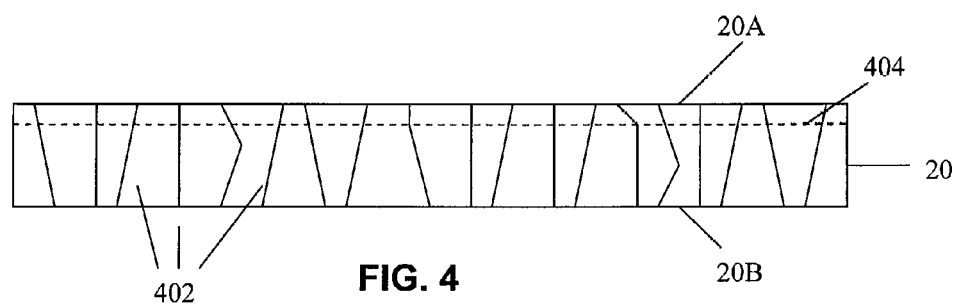
FIG. 4 illustrates certain advantages of a silicon sheet processed in accordance with aspects of the invention.

FIG. 4 illustrates certain advantages obtained by the invention. It should be noted that this drawing is for illustration purposes and is not necessarily to scale. As mentioned above, according to certain aspects, the directional solidification process of the invention allows larger grains to be formed and/or which have boundaries 402 that are substantially columnar so as to extend from one surface 20A of sheet 20 to an opposing surface 20B.

According to further aspects illustrated in FIG. 4, when sheet 20 is made of a p type material and is further processed and/or used to form a junction device such as a solar module, sheet 20 will include a thin n-type layer near the top surface 20A of sheet 20, thereby forming a p-n junction 404. Due to the substantially columnar grain structure made possible by the present invention, the properties of the sheet 20 will lead to improved electric field characteristics across the p-n junction 404, thereby improving the efficiency of solar cells comprising the sheet 20. It should be noted, however, that the invention is not limited to this example, and that the sheet material may be comprised of either p or n type material, and need not be intended for use as a junction device.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method of processing a sheet of silicon material having a top surface and bottom surface, the sheet further having outer dimensions bounding the sheet and defining an area, the method comprising:
   melting the material completely throughout the area of the sheet; and
   controlling a direction of solidification in the material normal to the horizontal surface of the sheet by establishing a thermal gradient in the material in the direction.

2. A method according to claim 1, wherein the melting step includes using rapid thermal processing to melt the material.

3. A method according to claim 1, wherein the material is a sheet comprised of one or more of multicrystalline, polycrystalline, micro-crystalline and amorphous silicon.

4. A method according to claim 1, wherein the controlling step is performed in accordance with desired material properties of the re-crystallized silicon.

5. A method according to claim 1, wherein the material is a sheet comprised of one or more of multicrystalline, polycrystalline, micro-crystalline and amorphous silicon, and wherein the controlling step is performed to produce substantially columnar grains between top and bottom surfaces of the sheet.

6. A method according to claim 1, further comprising providing a seed material to promote crystallization during the solidification.

7. A method of processing a sheet of silicon material, comprising:
   heating the sheet to completely melt the silicon material in the entire sheet to create a predetermined thickness of melted silicon material in the entire sheet; and
   controllably lowering the temperature of the heated sheet to allow the melted silicon material to recrystallize, the controllably lowering step including establishing a temperature gradient in the melted material,
   wherein the sheet has top and bottom surfaces, and
   wherein the temperature gradient is established in a direction normal to the horizontal surface of the sheet, and
   wherein the sheet further has outer dimensions bounding the sheet and defining an area, and
   wherein the heating step includes melting the material completely throughout the area of the entire sheet.

8. A method according to claim 7, wherein the temperature gradient is less than 20° C./cm.

9. A method according to claim 7, wherein the heating and controllably lowering steps are performed using rapid thermal processing.

10. A method according to claim 7, wherein the material is one or more of multicyrstalline, polycrystalline, micro-crystal line and amorphous silicon.

11. A method according to claim 7, wherein the material is one or more of multicyrstalline, polycrystalline, micro-crystalline and amorphous silicon, and wherein the controllably lowering step is performed to produce substantially columnar grains between top and bottom surfaces of the sheet.

12. A method according to claim 7, wherein the temperature gradient is established in correspondence with a desired direction of charge carrier flow in a device comprising the sheet.

13. A method according to claim 12, wherein the sheet is comprised of a first conductivity type material and is intended to be used in a device in which the sheet is doped with a second conductivity type at one of the top and bottom surfaces of the sheet.

14. A method according to claim 13, wherein the device is a photovoltaic device.

15. A method according to claim 7, wherein the sheet has top and bottom surfaces separated by a width, and wherein the recrystallization causes the material to have grain sizes larger than the width.

16. A method according to claim 7, wherein the sheet has top and bottom surfaces separated by a width, and wherein the predetermined thickness equals the width.

17. A method according to claim 7, wherein the sheet has top and bottom surfaces separated by a width, and wherein the predetermined thickness is less than the width.

18. A method according to claim 7, further comprising causing a seed material to be present at the predetermined thickness of the sheet.

19. A method according to claim 1, wherein the sheet of silicon material before processing comprises solidified drops, and wherein the area is at least 125 mm$^2$.

20. A method according to claim 7, wherein the sheet of silicon material before processing comprises solidified drops, and wherein the area is at least 125 mm$^2$.

* * * * *